(12) United States Patent
Cadieu

(10) Patent No.: US 6,805,916 B2
(45) Date of Patent: Oct. 19, 2004

(54) METHOD FOR MAKING FILMS UTILIZING A PULSED LASER FOR ION INJECTION AND DEPOSITION

(75) Inventor: Fred J. Cadieu, Great Neck, NY (US)

(73) Assignee: Research Foundation of the City University of New York, New York, NY (US)

( * ) Notice: Subject to any disclaimer, the term of this patent is extended or adjusted under 35 U.S.C. 154(b) by 0 days.

(21) Appl. No.: 10/622,264

(22) Filed: Jul. 17, 2003

(65) Prior Publication Data

US 2004/0013820 A1 Jan. 22, 2004

Related U.S. Application Data

(63) Continuation-in-part of application No. 10/051,211, filed on Jan. 16, 2002.
(60) Provisional application No. 60/262,051, filed on Jan. 17, 2001.

(51) Int. Cl.[7] .............................................. C23C 14/28
(52) U.S. Cl. .................. 427/475; 427/458; 427/475; 427/595; 427/596; 118/715; 118/722 R; 118/723 R; 118/723 VE; 118/726; 219/121.6; 219/121.85
(58) Field of Search ............................. 427/458, 475, 427/595, 596; 118/715, 722, 723 R, 723 VE, 726; 219/121.6, 121.85

(56) References Cited

U.S. PATENT DOCUMENTS

| 5,015,492 A | 5/1991 | Venkatesan et al. |
|---|---|---|
| 5,019,552 A | 5/1991 | Balooch et al. |
| 5,126,030 A | 6/1992 | Tamagaki et al. |
| 5,269,896 A | 12/1993 | Munemasa et al. |
| 5,733,609 A | 3/1998 | Wang |
| 5,760,366 A | 6/1998 | Haruta et al. |
| 5,858,478 A | 1/1999 | Radhakrishnan |
| 6,024,851 A | 2/2000 | Radhakrishnan |
| 6,103,074 A | 8/2000 | Khominich |
| 6,139,964 A | 10/2000 | Sathrum et al. |

OTHER PUBLICATIONS

Y.Y. Tsui et al., Guiding and Confinement of a Laser produced Plasma by a Curved Magnetic Field, Applied Physics Letters, vol. 70, No. 15, Apr. 14, 1997, pp 1953–1955.

Y.Y. Tsui et al., Magnetic Guiding of Laser Plasmas Proceedings of the 1998 IEEE International Conference on Plasma Science, 1998, p. 136.

*Primary Examiner*—Richard Bueker
(74) *Attorney, Agent, or Firm*—Darby & Darby

(57) ABSTRACT

A tapered profile magnetic field pulsed laser deposition (PLD) system and method for depositing a thin film on a substrate are provided. The system includes a tapered pulsed coil arranged relative to a confinement magnetic device so that the plume discharged from the confinement magnetic device is collected and concentrated by an inwardly tapered surface of the tapered pulsed coil which causes the plume to be deflected towards a substrate on which the charged species are deposited to form the thin film. In yet a further aspect, a device for maintaining cleanliness of an interior of a deposition chamber laser entry window through which a laser beam enters and converges to a target is provided. A plume that is generated when a laser beam ablates the target is ionized as a result of radioactive members such that the ionized plume is deflected toward one of the first members (e.g., metal plates) as opposed to coating the interior of the laser entry window.

13 Claims, 9 Drawing Sheets

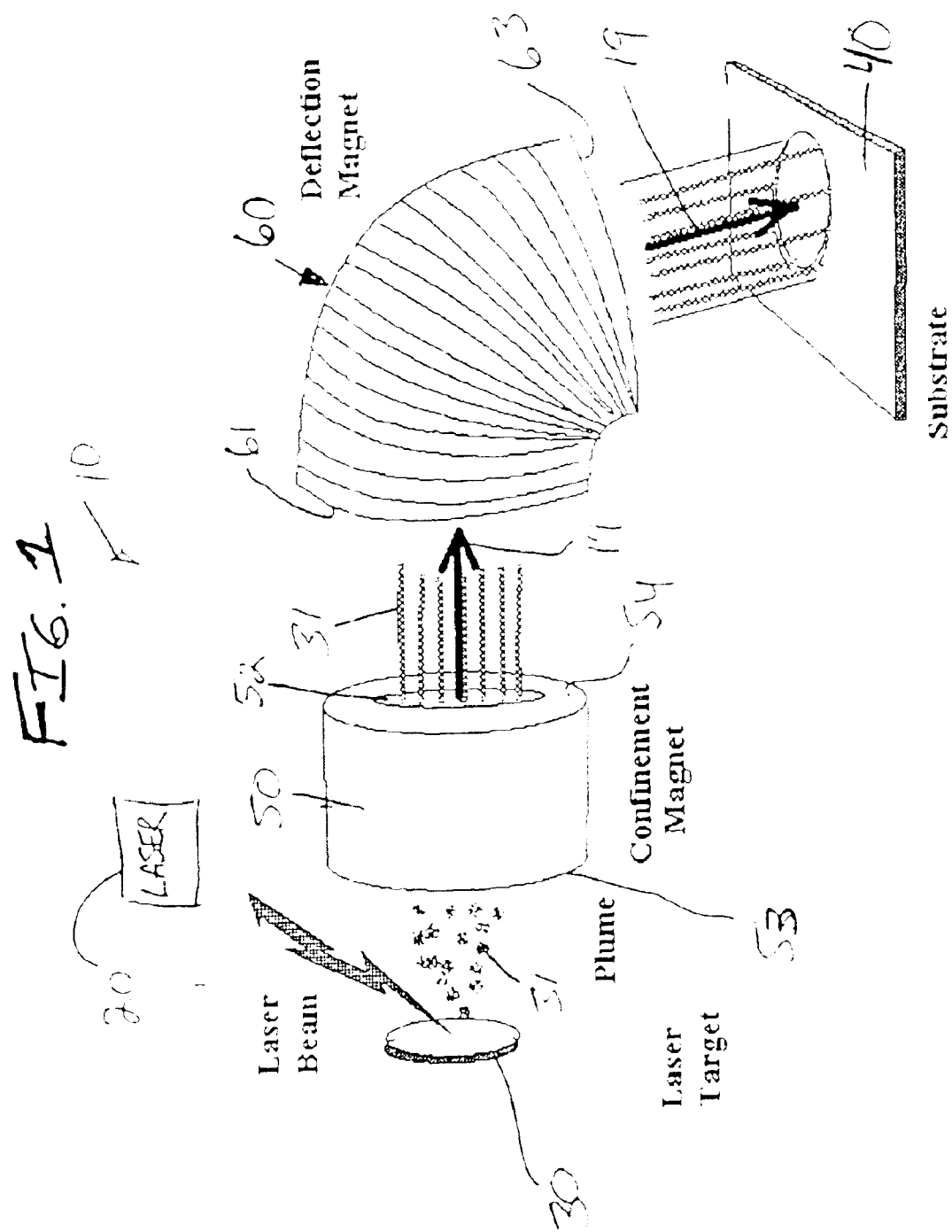

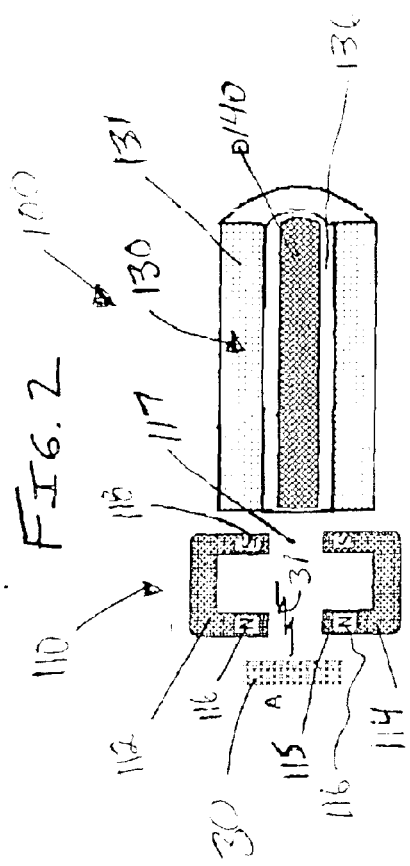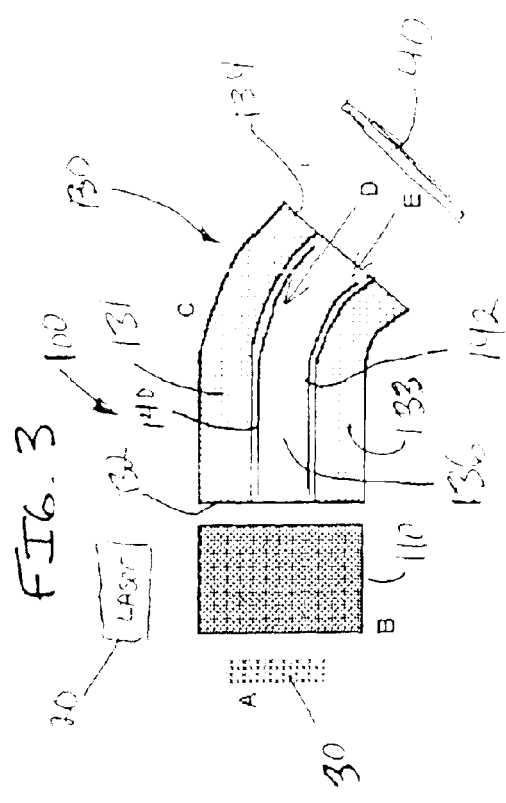

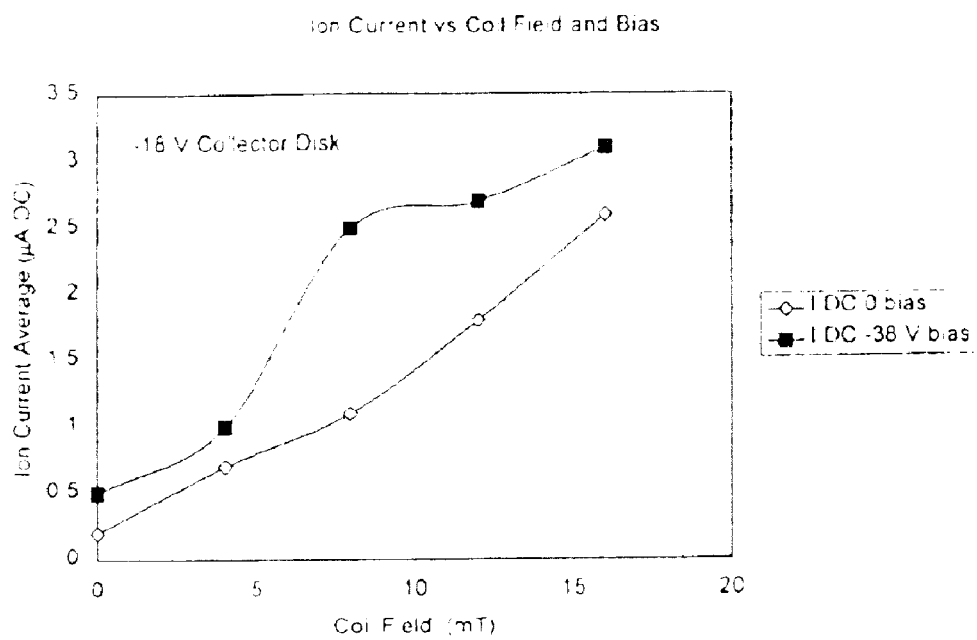
Fig. 5 shows the collector current for the second embodiment of the invention as a function of the deflection tube magnetic field level and deflection plate bias level

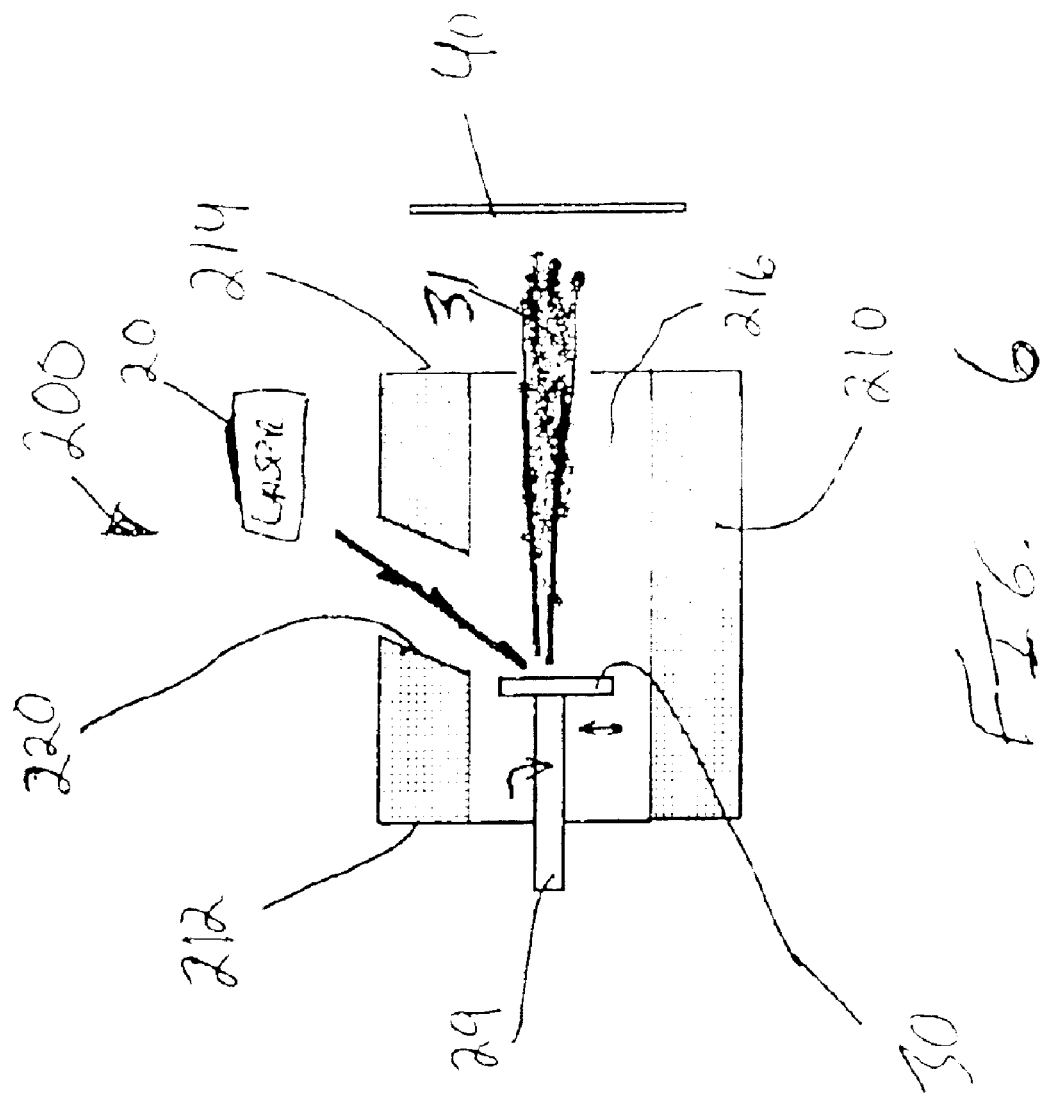

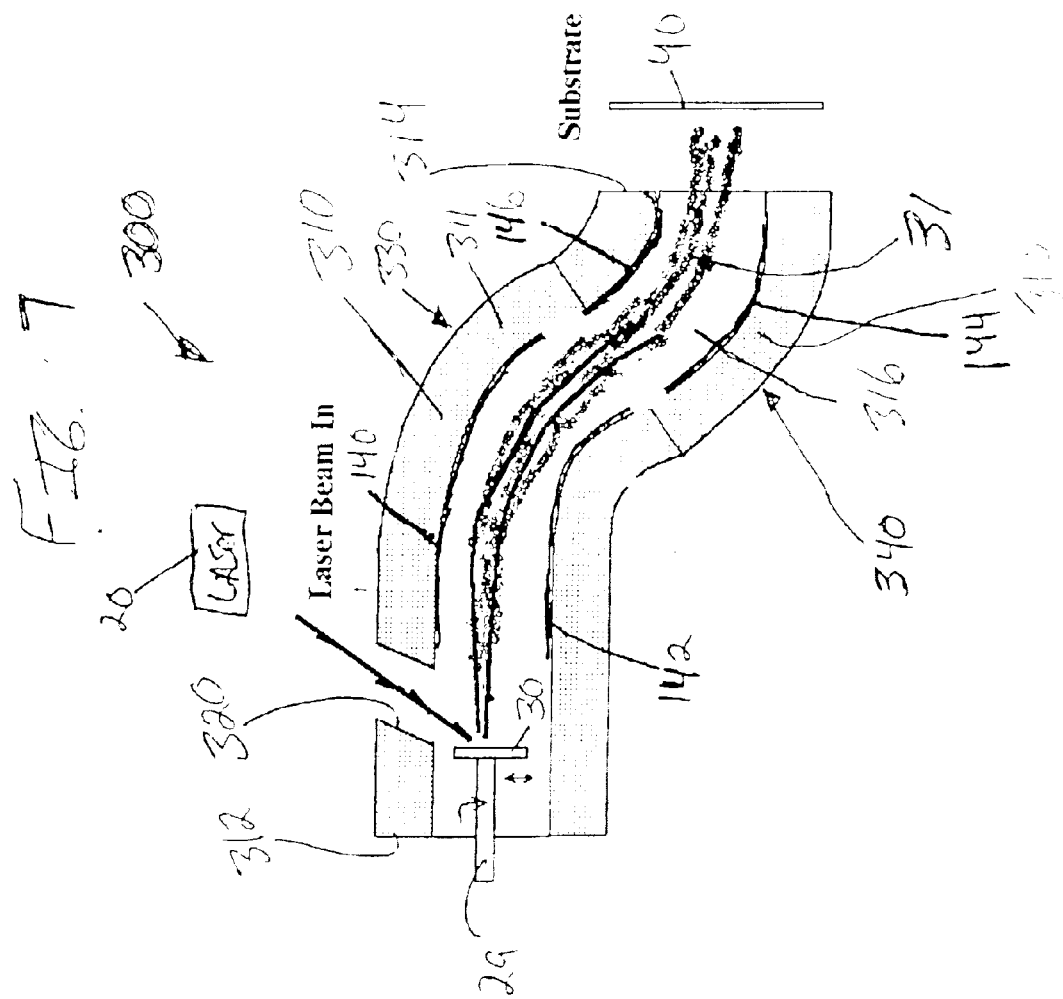

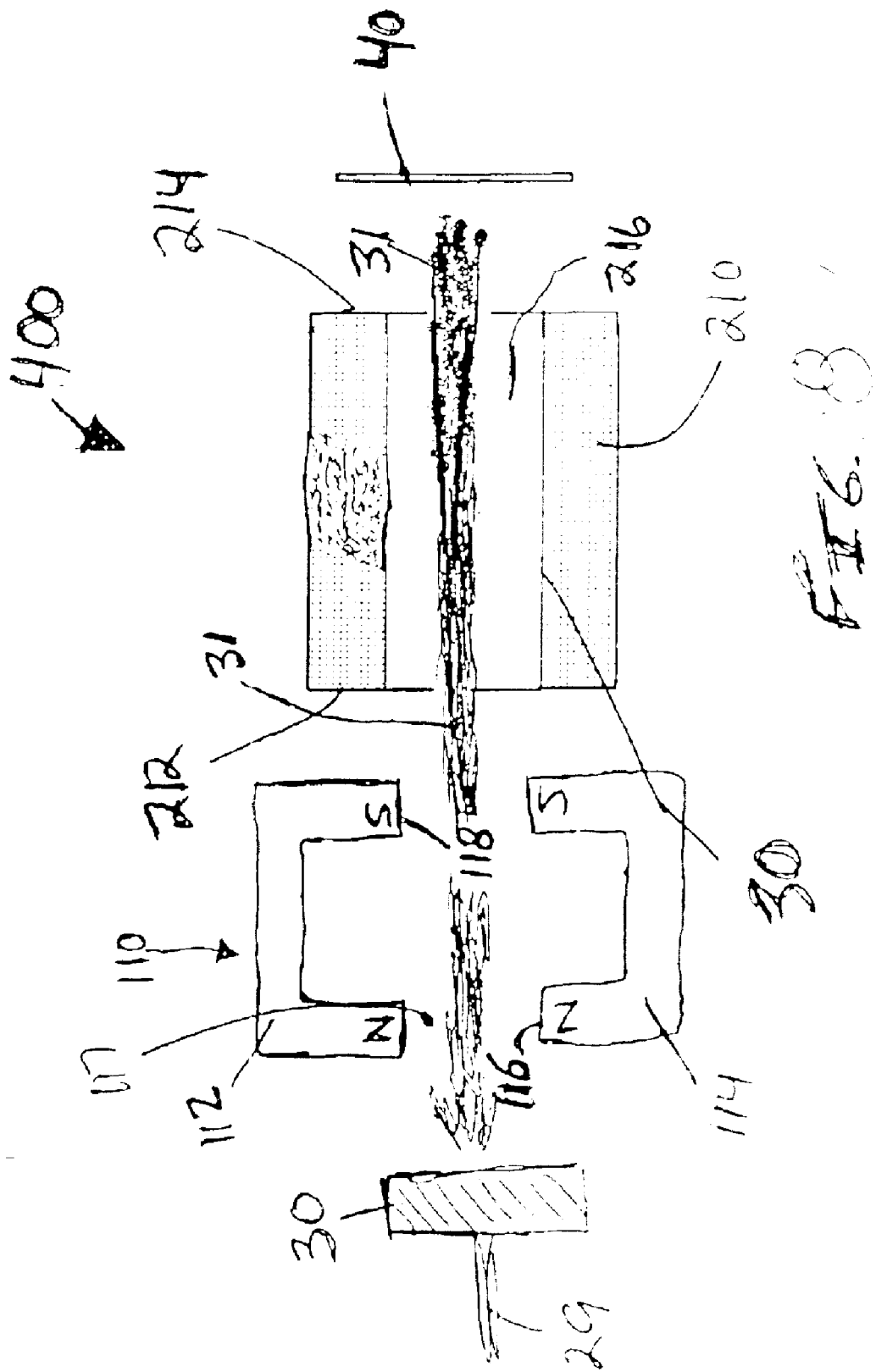

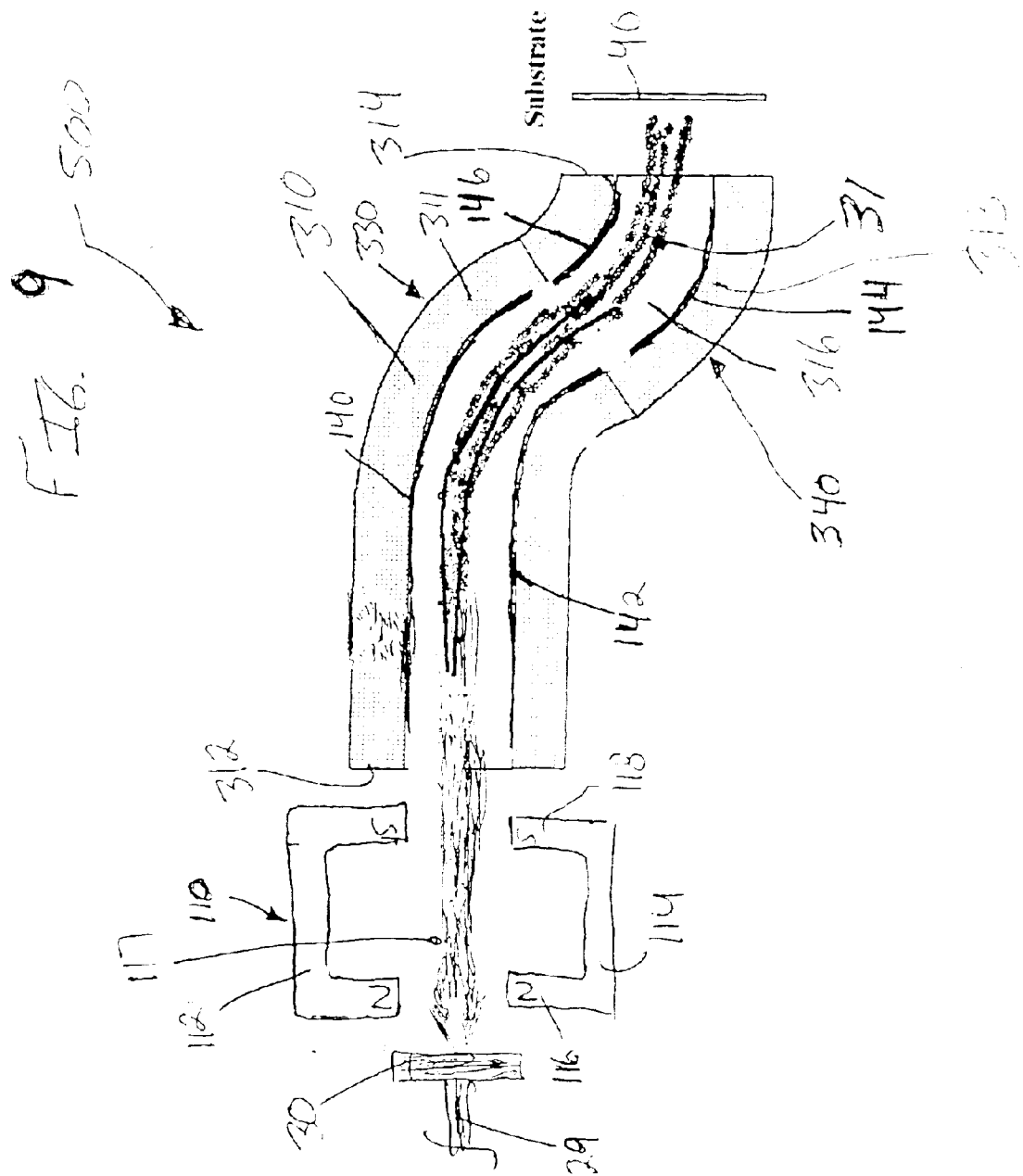

METHOD FOR MAKING FILMS UTILIZING A PULSED LASER FOR ION INJECTION AND DEPOSITION

CROSS-REFERENCE TO RELATED APPLICATIONS

This application is a continuation-in-part of U.S. patent application Ser. No. 10/051,211 filed Jan. 16, 2002 which claims the benefit of U.S. Patent Application Ser. No. 60/262,051, filed Jan. 17, 2001, all of which are hereby incorporated by reference in their entirety.

TECHNICAL FIELD

The present invention relates generally to processes for forming thin films and more specifically, relates to pulsed laser deposition methods using a desired target material for forming high quality thin films on a substrate.

BACKGROUND

Over the years, a number of different techniques have been developed and/or proposed for forming thin films on a substrate. As more and more applications for thin films are contemplated and new types of materials are discovered, there is a continuing need to produce high quality films. For example, the discovery of high $T_c$ superconductor materials precipitated a great deal of research into the development of a practical method for making such materials. The primary practical application for such materials is the formation of thin films which may be used in certain instruments, such as SQUIDS and bolometers. Thin films formed of these materials may also be used for the general fabrication of superconductors in the form of thin films deposited onto wires or tapes. This is only one type of thin film application which requires a fabrication method which offers the precision and high quality necessary to produce such films.

Pulsed laser deposition (PLD) is a versatile deposition technique that has been in use for several years. The technique is based upon the vaporization of a small region of a target material by a high power laser. The technique has particular application in the deposition of oxide films, such as high temperature superconductors, ferrites, and ceramic films. The target material is then subsequently collected on a substrate in the form of a film deposited onto the substrate surface. Typically, the technique employs a series of very short (nanosecond duration) pulses, principally from a laser source which ablates the surface of the target material and then by using various means, the target material is deposited as a thin film on the substrate. The PLD method offers many advantages over other types of techniques for forming a thin film on a substrate. For example, the PLD method offers ease of deposition and the formation of crystalline films with good adhesion at low temperatures, even as low as room temperature. Another advantage of the PLD technique is the ability to reproduce the stoichiometry of the target in the film, including that of the multi-component targets. PLD is desirable for routine deposition at room or higher temperatures providing high quality crystalline thin films.

PLD is an excellent method for use in superconductor film growth processes and other coating processes for forming high quality thin films. PLD involves laser ablation and evaporation of a target material by a high power laser. The ablated material forms a plume comprising both undesirable large particles and desirable atoms and ions which all get deposited on a substrate. More specifically, the plume includes ions, electrons, atom clusters, and larger particulates of varying sizes. The plume extends from the target in a direction outward from the target. Often, the substrate is positioned so that it is directly in front of the target, at a distance of a few inches. Thus, the plume spreads onto the substrate to form the thin film. In this arrangement, the direct plume has a range of atom clusters and particulate sizes. The substrate may also be placed alongside the plume to collect a greater percentage of atomic species but at a lower deposition rate.

One of the disadvantages of using the PLD technique is that undesirable particulates form a part of the plume and are directed onto the substrate. These particulates generally constitute the large particles which are present in the plume and have sizes on the order of between about 0.1 to about 5.0 µm in size. The inclusion of this size of particles in the thin film disadvantageously limits PLD commercialization. Most of the conventional PLD methods disadvantageously produce a particle density of about 400 particles per $cm^2$.

The laser ablation of the target material also results in the creation of charged and neutral species having a varying degree of sizes. Only species of atomic dimensions of the target material are desired to be deposited on the substrate to form the thin film. If larger sized particulates form on the substrate, these particulates limit the uniformity of the deposited thin films and its applications. These particulates are formed as a result of a number of factors relative to the target. More specifically, the target may include a protruding surface; the target may have micro-cracks that are mechanically dislodged due to laser induced thermal or mechanical shock during the laser ablation process. In addition, larger particulates may be formed as a result of rapid expulsion of trapped gas bubbles beneath the target surface during laser irradiation and also the splashing of molten layers of the target material may result in the formation of larger particulates.

The presence of larger particulates in the thin film has serious ramifications in some specialized applications, such as tribological applications. In these type of applications, it is desirable to deposit coatings with very high hardness on precision bearings. These hard coatings can protect the steel surfaces of the bearings from wear and thereby improve the lifetime of the bearings. By increasing the lifetime of the bearings, the performance of a variety of moving mechanical assemblies can be improved. For example, machinery and pump performance can be improved due to this improved wear. PLD is an excellent technique for depositing such hard coatings; however, the incorporation of larger, hard particulate material in the coatings negatively impacts the performance of the bearings as these materials often have abrasive-like properties. The presence of abrasive-like particles in the coating can act to deteriorate and destroy the coating. This results in the production of more debris and also to a loss of coating adhesion.

Another limitation of the PLD method is that it is difficult to scale up the deposition process to accommodate larger size substrates having a surface area of about 10 $cm^2$. To grow large area uniform films requires that the substrates be moved to accommodate uniform deposition over a larger area than the physical plume size.

Accordingly, the predominant problem with PLD methods is the creation and deposition of large particulates that impose a limitation on the potential scope of applications for the PLD method. These and other disadvantages or problems are solved or reduced using the apparatus and method of the present invention.

SUMMARY

According to the present invention, a method for forming high quality thin films using a pulsed laser deposition (PLD)

system is provided. In one exemplary embodiment, the system includes a PLD chamber wherein a laser beam ablates a target material creating an ionized plasma plume of ions and electrons which is diverted and deposited onto a substrate using a confinement magnet followed sequentially by a deflection magnet.

More specifically, the ablation of the target creates a plume of atomic species atoms, ions, electrons, atomic clusters, and particulates of varying sizes. The target is disposed in close proximity to the confinement magnet so that the plume is directed into the confinement magnet. The confinement magnet generates a magnetic field parallel to the plume ejection direction from the laser target. This magnetic field counters the tendency for the plume to naturally diverge and therefore acts to focus and concentrate the plume as it travels away from the target.

The concentrated plume is then introduced into the deflection magnet which includes magnetic coils and serves to apply a magnetic field to deflect the electrons and accompanying ions to the substrate. In one embodiment, the deflection magnet is a tubular magnetic member having an opening extending therethrough for receiving the plume. The deflection magnet generates an axial magnetic field which is parallel to the laser plume ejection direction (similar to the confinement magnet). The deflection magnet has a bend formed therein at an end proximate to the substrate for directing the plume onto the substrate which is disposed away from a longitudinal axis extending through the target and the confinement magnet. The magnetic field generated in the deflection magnet, including the bent portion thereof, constitutes a mechanism for filtering the neutral, uncharged matter (e.g., the atomic clusters and the particulates) of the plume from the charged matter (the atomic species atoms and the ions). The uncharged matter is not influenced by the magnetic field and thus travels in a relatively linear trajectory from the target through the confinement and deflection magnets. In this manner, only the charged matter is deflected onto the substrate to form the thin film and the undesirable atomic clusters and particulates are not deflected onto the substrate.

In another aspect of the present invention, deflector plates are disposed within the deflection magnet and an electric field is generated across the plates. A negatively charged plate acts to repel negative electrons away from the outer curved wall of the deflection magnet and toward a positively charged plate on an opposite surface of the deflection magnet. Because the positive ions are attracted to the negative electrons, the ions are thus assisted, especially in the bent portion, in following the electrons along the magnetic field direction of the deflection magnet toward the substrate.

Accordingly, the present invention, provides a simple, relatively inexpensive, yet effective PLD method of forming extremely clean films with reduced particulate densities and size. This method favors useful film properties, such as crystallinity and good adhesion, event at room temperature, because it relies upon using high energy ions for the deposition. The method therefore has tremendous potential for applications where the substrate is thermally sensitive. The present method may be applied to the production of a film from a great number of materials.

In yet another aspect, a tapered profile magnetic field pulsed laser deposition (PLD) system and method for depositing a thin film on a substrate are provided. The system includes a platform for holding a target; a laser source producing a laser beam that is focused on the target to form a plume having charged species and neutral species; as well as a confinement magnetic device disposed proximate to the target such that the plume is influenced by a first magnetic field generated by the confinement magnetic device. The first magnetic field causes the plume to become more focused and is substantially parallel to a plume ejection direction of the plume as it travels away from the target. The system also includes a tapered pulsed coil arranged relative to the confinement magnetic device so that the focused plume discharged from the confinement magnetic device is collected and concentrated by an inwardly tapered surface of the tapered pulsed coil which causes the plume to be deflected towards a substrate on which the charged species are deposited to form the thin film.

In yet a further aspect, a device for maintaining cleanliness of an interior of a deposition chamber laser entry window through which a laser beam enters and converges to a target is provided. The device includes a pair of first members disposed between the laser entry window and the target with a space formed therebetween. A pair of radioactive members are disposed in the space between the pair of first members and the first members are operatively connected to a voltage source and ground so that a voltage potential difference is created therebetween. The converging laser beam enters the space between the first members at one end thereof and travel therebetween in a converging manner toward the target. A plume that is generated when the laser beam ablates the target is ionized as a result of the radioactive members such that the ionized plume is deflected toward one of the first members as opposed to coating the interior of the laser entry window.

Other features and advantages of the present invention will be apparent from the following detailed description when read in conjunction with the accompanying drawings.

BRIEF DESCRIPTION OF THE DRAWINGS

The foregoing and other features of the present invention will be more readily apparent from the following detailed description and drawings of illustrative embodiments of the invention in which:

FIG. 1 is a side perspective of a magnetic field pulsed laser deposition system according to a first embodiment;

FIG. 2 is a partial perspective cross-sectional side elevational view of a magnetic field pulsed laser deposition system according to a second embodiment;

FIG. 3 is a top plan view, shown in partial cross-section, of the deposition system of FIG. 2;

FIG. 5 shows the collector current for the second embodiment of the present invention as a function of the deflection tube magnetic field level and deflection plate bias level;

FIG. 6 is a cross-sectional view of a magnetic field pulsed laser deposition system according to a third embodiment;

FIG. 7 is a cross-sectional view of a magnetic field pulsed laser deposition system according to a fourth embodiment;

FIG. 8 is a cross-sectional view of a magnetic field pulsed laser deposition system according to a fifth embodiment;

FIG. 9 is a cross-sectional view of a magnetic field pulsed laser deposition system according to a sixth embodiment;

DETAILED DESCRIPTION OF THE PREFERRED EMBODIMENTS

Figure 4B:
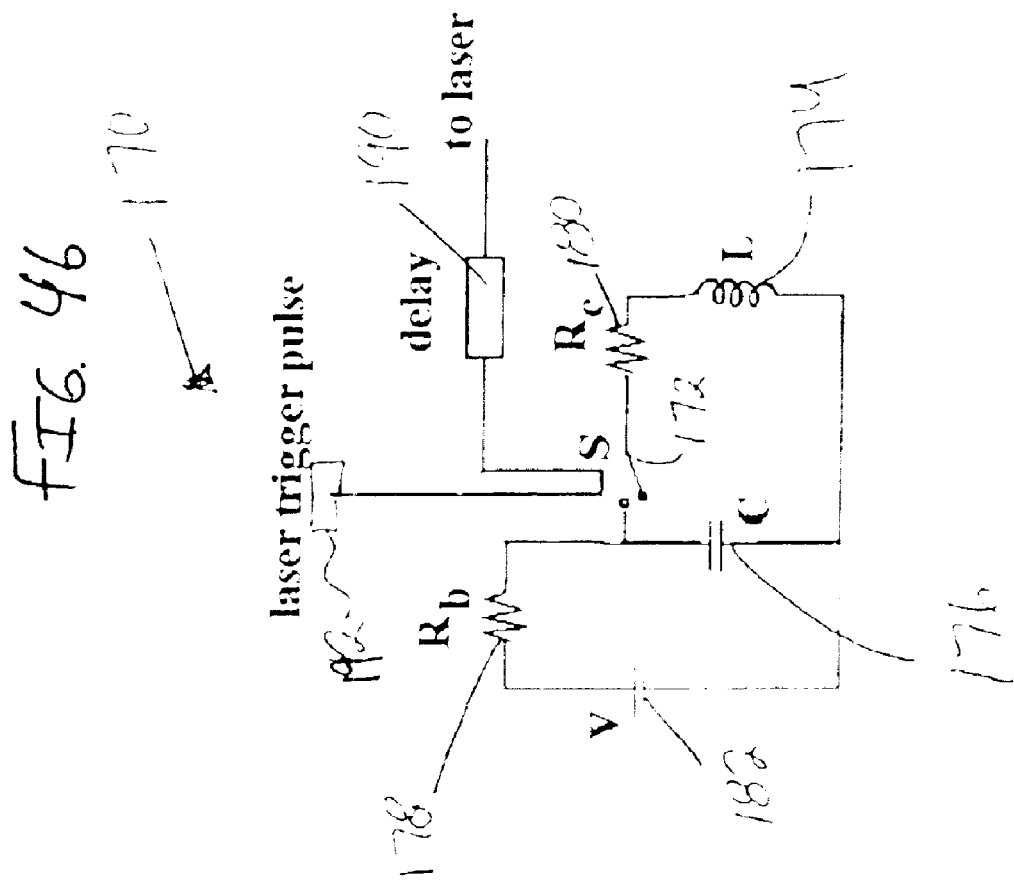
FIGS. 4a and 4b illustrate two circuits for generating current to supply a magnetic field in the deposition system according to one exemplary embodiment.

Referring to FIG. 1 and in accordance with the present invention, a magnetic field pulsed laser deposition (PLD) system for obtaining highly uniform and smooth films with the PLD process is generally shown at 10. An excimer laser 20 operating with a selected gas or gas mixture and having a predetermined wavelength along with a pulse width is used to provide a laser beam. For example, the laser 20 may operate with a mixture of Ne, Kr and F gases. The laser light preferably has an ultraviolet wavelength of about 248 nm. One suitable laser 20 is a Lambda Physik excimer laser Model LPX 305Fi which operates with an energy per pulse of about 1000 to about 1300 mJ at a repetition frequency of about 10 to about 50 Hz. The laser pulse duration is typically about 10 to about 30 ns and more preferably from about 10 to about 15 ns.

The laser beam is focused on a target 30 of choice which is typically held in a target holder (not shown). The target 30 is formed of any number of types of solid materials which are laser ablatable. The target is selected in view of the type of thin film the user desires to produce using the PLD method. For example, the target 30 may be formed of one element or may be formed of several elements. The target 30 may be formed of titanium, aluminum, aluminum nitride, titanium nitride, carbon, cobalt compounds, such as samarium cobalt and iron cobalt, and carbide compounds, such as titanium carbide. The target 30 is preferably placed in the target holder and is rotated at a selected speed, i.e., 10–100 rpm, during the PLD method. The target 30 may also be oscillated during the process so that the laser beam erodes a circular region of the target 30.

The system 10 also includes a substrate 40 on which the thin film is formed from the ablation of the target material 30. The substrate 40 can be any solid material which is appropriate because of its mechanical, optical, electronic, or chemical properties. A reactive gas may be introduced into the system so that it reacts with a plasma plume 31 created when the target 30 is vaporized forming a new material which is ionized and directed toward the substrate 40 for deposition of the thin film thereon. For example, a low pressure gas, such as oxygen or nitrogen can be used to accomplish reactive deposition for the deposition of oxides and nitrides respectively. For example a TiC target and nitrogen reactive gas may produce ionized TiCN which is then directed to the substrate 40. In another example, methane gas ($CH_4$) with a Ti target 30 can be used to deposit TiC films. Similar to the target holder, the substrate 40 may be disposed in a substrate holder (not shown) which also may be caused to rotate to produce a more uniform film. It is also within the scope of the present invention that the substrate 40 may be heated to an elevated temperature or maintained at room temperature and furthermore, the substrate 40 may be electrically biased to improve the rate of film growth. In the exemplary embodiment, a target of a material is used to deposit a film of the same material.

When the laser 20 is activated, pulsed energy is directed to a region of the target 30 to form the plume 31 of vaporized target material containing ions, electrons, larger atom clusters, and particulates. In accordance with the present invention, the atomic species atoms and the ions are then collected onto the substrate 40 while the atomic clusters and particulates remain largely in line of sight trajectories and are discriminated against so that they are not deposited onto the substrate 40. The pulsed laser ejection plume 31 is used as an ion source for subsequent deflection and collection. The deposited film then results from the impingement of uniformly atomic species.

The system 10 also includes a confinement magnet 50 and a deflection magnet 60. The confinement magnet 50 is a permanent magnet having an opening 52 extending therethrough from one end 53 to another end 54. The exemplary confinement magnet 50 thus is a ring-like member which is used to produce a magnetic field parallel to the plume ejection direction in front of the laser target 30. The target 30 is arranged relative to the confinement magnet 50 so that the formed plume 31 is directed into the opening extending axially through the confinement magnet 50. The magnetic forces of the magnet 50 counters the natural divergence of the plume 31 and acts to focus the plume 31 within this area as it is directed toward the substrate 40 and away from the target 30.

The confinement magnet 50 is also designed to focus the electrons and because of the magnetic field applied by the confinement magnet 50, the electrons follow a spiral or helical path along the magnetic field as the electrons travel through the confinement magnet 50. The confinement magnet 50 generates higher ion density within the plume 31 as the magnetic field causes the electrons to ionize surrounding neutral atoms. This is the case because as the electrons travel in the helical path, the probability that the electrons will collide with neutral atoms increases. As this occurs, an increased ion density results and the ions are "dragged" along with the electrons to the substrate 40.

In the first embodiment shown in FIG. 1, the deflection magnet 60 is formed of magnetic field coils which apply a magnetic field to deflect the electrons and accompanying ions to the substrate 40 placed away from the direct line of sight from the target 30. The deflection magnet 60 may be formed of a series of spaced magnetic coils such that the magnet 60 has a section which is angled (bent) so that the plume 31 is directed onto the substrate 40 (which is disposed away from the direct line of sight of the target 30). The deflection magnet 60 is angled at one end 63 so that it directs the contained plume 31 to the substrate 40. In the exemplary embodiment, the end region 63 of the deflection magnet 60 opposite the end region 61 (which faces the confinement magnet 50) is angled relative to the end region 61. In the illustrated embodiment, the deflection magnet 60 has about a 45° angled end region 63.

The deflection magnet 60 is preferably an annular member and more specifically has an opening extending axially therethrough from end region 61 to end region 63. The deflection magnet 60 may therefore be formed of a unitary member having a series of magnetic coils or it may be formed of a series of separate magnetic coils which are spaced apart from one another. In the case of the latter, the magnet 60 may be easily bent to incorporate the desired angle into the magnet 60 so as to properly direct the plume 31 onto the substrate 40. The opening receives the concentrated plume 31 as it exits the confinement magnet 50 and the magnetic field applied by the coils influences the direction of travel of the charged matter. Therefore, the bending of the deflection magnet 60 permits the travel direction of the charged matter to be controlled and directed toward the substrate 40. The general direction in which the charged matter travels is indicated by arrows 19.

Because the atomic clusters and the particulates are not charged, they are not influenced by the magnetic field and therefore will travel in an axial direction which is generally parallel to the longitudinal axis of the confinement magnet 50. The uncharged matter will therefore not be deflected to the substrate 40 but rather will proceed in a "line of sight" trajectory relative to the target 30. This advantageously results in the atomic clusters and particulates not being deposited onto the substrate 40. Conversely, the charged matter, i.e., the electrons and accompanying ions, is influenced by the magnetic field and is deflected to the substrate 40.

Accordingly, the present invention provides an apparatus and method of collecting the atomic species atoms and the ions onto the substrate 40 to form a thin film, while the atomic clusters and particulates remain largely in line of sight trajectories and are discriminated against. In addition, the pulsed laser ejection plume 31 is used as an ion source for subsequent deflection and collection. Since the deflection mechanism acts upon the electrons and the ions are dragged along, multi-element targets 30 can be utilized as well as single element targets 30.

In another aspect of the present invention, the deflection magnet 60 may include one or more baffle members or a roughened internal surface (not shown), both of which are designed to capture large atomic clusters and particulates as the plume 31 travels through the deflection magnet 60. In other words, by modifying the internal surface structure of the deflection magnet 60, a mechanism is created to capture and retain the larger undesirable matter, i.e., atomic clusters and particulates. This matter becomes lodged within the modified internal surface due to its size and construction and thus, its forward progress is inhibited.

Now referring to FIGS. 2–5, a magnetic field pulsed laser deposition system according to a second embodiment of the present invention is generally indicated at 100. The system 100 includes the target 30, the substrate 40 and a confinement magnet 110. The confinement magnet 110 actually is formed of a pair of permanent magnets 112, 114 which are used to produce a magnetic field parallel to the plume ejection direction in front of the laser target 30. Each of the magnets 112, 114 has a north (N) pole 116 and a south (S) pole 118. Magnets 112, 114 are arranged so that the N pole 116 of the magnet 112 opposes the N pole 116 of the magnet 114 and the S pole 118 of the magnet 112 opposes the S pole 118 of the magnet 114. The like magnetic poles 116, 118 oppose each other so that the magnetic field from each of the magnets 112, 114 loops from the N magnetic pole 116 to the S magnetic pole 118 of each of magnets 112, 114 creating a magnetic field that is substantially parallel to the plume direction. This parallel magnetic field prevents the plume 31 from further converging and actually causes the plume 31 to become refocused into a narrow plume 31 as it travels through the confinement magnet 110.

In one embodiment, the confinement magnet 110 generates a magnetic field that has an amplitude of about 45 mT (milli-Tesla) parallel to the plume 31 direction. In this manner, a relatively strong magnetic field can be created without introducing a joule heating that would accompany a magnetic field generated by introducing a current in a resistive solenoid. As can be seen from FIG. 2, a gap 117 is formed between the magnets 112, 114 and the laser 20 may be positioned so that the laser beam is directed through this gap 117 onto the target 30. The target 30 is disposed a predetermined distance from one end 115 of the magnets 112, 114. The distance the target 30 should be placed from the magnets 112, 114 depends upon several factors, including but not limited to the type of material forming the target 30. In any event, the target 30 and the magnets 112, 114 should be placed at a distance where substantially all of the plume 31 will be directed into the gap 117. In one embodiment, the target 30 is placed at a distance of from about 1 cm to about 4 cm and preferably from about 1 cm to about 2 cm. It will be appreciated that these distances are merely exemplary in nature and other distances may be used. As best show in FIG. 2, the central region of the target 30 at which the laser beam is directed should be axially aligned with the gap 117 so that the plume 31 travels into the gap 117. Thus, one of the advantages of this configuration is that the laser 20 has free access to the target 30 from one of two sides. Furthermore, the target 30 is conveniently located so that it may be freely and easily replaced. One type of target 30 is a cylindrical laser target having a diameter of about 25 mm and a thickness of about 6 mm.

The system 100 also includes a deflection magnet 130 which is used to generate an axial magnetic field in a direction parallel to the laser plume ejection direction, similar to the confinement magnet 110. The deflection magnet 130 has a first deflection section 131 and a second deflection section 133. The deflection magnet 130 is preferably in the shape of a tubular magnetic member and includes a first end 132 and an opposing second end 134 with the first end 132 being spaced from and facing the confinement magnet 110. The second end 134 is positioned proximate to the substrate 40 so that the charged matter is directed out of the second end 134 and onto the substrate 40 to form the thin film. As best shown in FIG. 2, in one exemplary embodiment, each of the first and second deflection sections 131, 133 is a semicircular magnetic core surface with an opening 136 being formed between the opposing first and second deflection sections 131, 133, as best shown in the top plan view of FIG. 3. The opening 136 extends axially along a longitudinal direction of the sections 131, 133. In one exemplary embodiment, the deflection magnet 130 is solenoid coil formed of suitable magnetic material. In other words, the deflection magnet 130 is a member which contains the plume 31 and directs it to the substrate 40. According to one exemplary embodiment, the deflection magnet 130 is a solenoid coil wound from #18 gauge copper magnet wire which is used to generate an axial magnetic field along the length of the deflection magnet 130 and in the same direction as the axial magnetic field generated by the magnets 112, 114. Thus, both the confinement magnet 110 and the deflection magnet 130 generate axial magnetic fields. It will be appreciated that any number of other magnetic members may be used so long as the member generates an axial magnetic field along the length of the deflection magnet 130.

Further, because the deflection magnet 130 is a tubular member, the opening 136 has a generally annular shape and has a selected diameter which is sufficient to receive substantially all of the plume 31 after it is formed and travels through the confinement magnet 110. Thus, there is a relationship between the size of the gap 117 and the diameter of the opening 136 since the diameter of the opening 136 should be of similar size as the gap 117 so that the focused plume 31 exiting the gap 117 properly enters the opening 136. In one exemplary embodiment, the diameter of the opening 136 is about 3.5 cm.

As best shown in FIG. 3, the deflection magnet 130 has a bend incorporated along a portion of its length. More specifically, the second end 134 is bent relative to the first end 132 so that the plume 31 enters the deflection magnet 130 along one axial direction and exits the deflection magnet 130 along another axial direction. An angle is formed between these axises and in one exemplary embodiment, the angle is about 45°. In other words, a 45° bend is incorporated into the deflection magnet 130 so that selected components of the plume 31 exit the deflection magnet 130 at about a 45° angle relative to the axis containing the plume 31 as it enters the deflection magnet 130 and the target 30. The substrate 40 is positioned so that it faces the opening 136 at the second end 134.

The system 100 also includes first and second deflector plates 140, 142 which are disposed within the opening 136 of the deflection magnet 130 so that they extend along an axial length of the deflection magnet 130. The first and second plates 140,142 are formed of a conductive material and are preferably in the form of metal strips. In one exemplary embodiment, the first and second plates 140, 142 have a width of about 1.5 cm. The first and second plates 140, 142 may have other widths with a maximum width being slightly less than ½ the radius of the opening 136. The first and second plates 140, 142 are arranged along opposite sides of the deflection magnet 130 within the opening 136 so that one surface of one of the plates 140, 142 faces the other. The plates 140, 142 may have any number of shapes and in the exemplary embodiment, the plates 140, 142 are generally rectangular shaped. The first plate 140 is also referred to as an outer plate and the second plate 142 is referred to as an inner plate. Because of the bend in the deflection magnet 130, the first plate 140 is disposed on an outer curvature portion (first section 131) of the magnet 130 which has a greater axial length from end 132 to end 134 while the second plate 142 is disposed on an inner curvature portion (second section 133) of the magnet 130 and therefore has a lesser axial length from end 132 to end 134.

Preferably, the first and second plates 140, 142 are insulated from the deflection magnet 130 using known techniques. For example, a glass substrate (not shown) may be disposed between each of the plates 140, 142 and the respective section of the deflection magnet 130. According to the present invention, a negative voltage is applied to the first plate 140 relative to the second plate 142. The voltage is applied to the plates 140, 142 using known techniques, including the use of one or more external or internal power supplies. By applying respective voltages to the plates 140, 142, an electric field is generated and is directed across the inner tube diameter (across the opening 136). More specifically, the electric field is directed from the second plate 142 toward the first plate 140 across the opening 136.

The operation of the system 100 will now be described. As with the system 10, the laser 20 is actuated and a laser beam is directed upon the target 30 to produce the plume 31. The plume 31 then enters the gap 117 between the magnets 112, 114. The magnetic field generated by the magnets 112, 114, in a direction parallel to the plume ejection direction, causes the diverging plume 31 to converge and become more focused as it travels within the gap 117 between the magnets 112, 114. Furthermore and as previously-mentioned, the magnetic field causes the electrons to travel in a generally helical-like path and causes increased ionization of the plume 31 as electrons strike neutral atoms. All of the constituents of the plume 31 exit the magnetic field generated by the magnets 112, 114 and then enter the opening 136 at the first end 132 of the deflection magnet 130.

The axial magnetic field generated by the deflection magnet 130 influences the charged components of the plume 31 and by incorporating a bend into the deflection magnet 130, the charged components are deflected, while the neutral components are not deflected. The magnetic field also acts on the charged components and therefore, the present invention uses the applied magnetic field and the configuration of the deflection magnet 130 to filter and deflect the desired charged components, while the neutral components simply travel along the initial ejection direction. In one exemplary embodiment, the deflection magnet 130 generates magnetic field levels that are strong enough to magnetize the electrons and cause them to spiral along the magnetic field lines with a helical radius that is less than that of the inner tube diameter (the diameter of opening 136). The magnetic field levels are not strong enough to appreciably deflect the ions over the length of the coil length. For example, the magnetic field levels may be between about 10 mT and about 100 mT. Because of the electrostatic attraction between the electrons and the ions, the ions are caused to deflect in response to the deflection of the electrons (so called "dragging of the ions" by the electrons).

The result is that the electrons and ions are deflected due to the magnetic field, while the atom clusters and the particulates are not deflected. As best shown in FIG. 3, the plume 31 enters the opening 136 generally having a first axial direction. This first axial direction extends through the gap 117 and is generally perpendicular to the target 30. Because the first and second sections 131, 133 have bends, the opening 136 does not define a linear path but rather defines a curved path. Accordingly, any constituent of the plume 31 which travels along the first axial direction will impact and strike one of the walls of the sections 131, 133. More specifically and as shown in FIG. 3, the first axis intersects the section 131 (outer curvature of the deflection magnet 130) and therefore any component traveling along the first axis impacts the section 131.

Because the second plate 142 is positively charged and an electric field is directed across the opening 136 toward the first plate 140, the negative electrons are repelled from the outer curvature (section 131 of the deflection magnet 130) because of their like charge. The first plate 140 thus assists in keeping the electrons away from the outer curvature of the magnet 130 and instead, the positive ions are dragged with the electrons and are directed toward the center region of the opening 136 and toward the second plate 142. The ions are thus assisted to follow the electrons along the magnetic field direction toward the substrate 40 where the thin film is formed. Accordingly, one of skill in the art will appreciate that by providing the arrangement shown in FIGS. 2 and 3, the desired components of the plume 31 are effectively delivered to the substrate 40, while the undesirable components, i.e., the atomic clusters and particulates are not directed to the substrate 40 and thus do not adversely impact the formation of the thin film.

According to the present invention, any number of methods of powering the magnet coil (magnets 130) may be used. Two exemplary methods of the powering the deflection magnet 130 are illustrated in the circuit diagrams of FIGS. 4a and 4b. In one embodiment, a direct current (DC) is used to generate a steady magnetic field in the coil (deflection magnet 130) for causing the deflection of the discharge plasma generated by the laser pulse through an angle of about 45°. This embodiment is generally illustrated in FIG. 4a. A circuit 160 is shown for generating the current to supply the magnetic field in the coil which is denoted by its inductance 162. In the first embodiment, a straight continuous current is generated in the coils and the circuit 160 is defined by a voltage source 164 connected in series to the coil (inductance 162) with the magnetic coil having a resistance, generally indicated at 166.

In the exemplary magnet coil (deflection magnet 130), it is preferred to generate a magnetic field of about 4 mT per ampere. A DC current of about 4 A is required to generate an axial magnetic field of about 16 mT. The magnet coil has a resistance of about 4 ohm. Consequently, for a magnet current of 2 A, the power dissipated is 16 watts, and at 4 A only 64 watts is dissipated. This heating is far less than in designs that have all the magnetic fields generated by electromagnets.

Figure 4A:
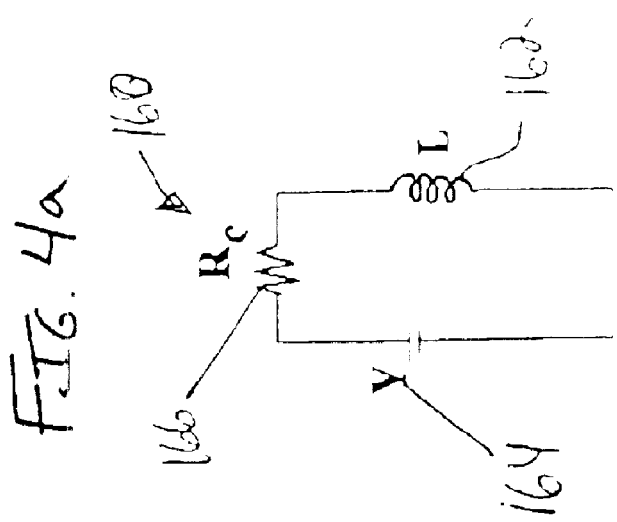

A second method for generating the current to supply the magnetic field in the deflection magnet coil is illustrated in FIG. 4b. In this second method, the time over which the magnetic field is present can be restricted to the time in which the guided plasma discharge is present. This can reduce the duty cycle of the deflection coil and lower the heat load on the system 100. This second method is illustrated by a circuit 170 which is designed so that the trigger pulse used to generate the laser pulse is also used to close a switch 172 which connects the coil, denoted by inductance 174, across a capacitor 176. The circuit 170 has a first resistor 178 and a second resistor 180 with the first resistor 178 being in series with a voltage source 182 and the capacitor 176. The second resistor 180 is in series with the switch 172 and the coil (inductance 174). The first resistor 178 has a value which is significantly less than the value of the second resistor 180. A time delay 190 is incorporated into a laser trigger pulse circuit, generally indicated at 192, so that the magnetic field in the coil reaches its maximum value before the laser 20 (FIG. 1) is fired. In other words, once the switch 172 closes, current flows to the coil and causes the generation of the magnetic field. The time delay 190 prevents the laser 20 from immediately firing an energy pulse upon the closing of the switch 172, but rather the energy pulse is fired after a predetermined amount of time has passed. This delay ensures that the plume 31 is effectively deflected because the magnetic field has time to reach an optimum strength.

To illustrate the effectiveness of the system 100, the normal substrate has been replaced by a metal disk having an area of about 1 $cm^2$. This probe disk has an area that is much less than that of the deflector tube inner cross sectional area and is located 1.5 cm beyond the deflection magnet 130 along the tube inner center line. The probe disk is situated normal to the axis of the deflection magnet 130. The metal disk is biased to −18 V to collect positive ions. Other disk bias levels could also be used. If the deflection magnet coil current is zero, then very little ion current arrives at the probe disk. This is shown in FIG. 5. The average DC ion current collected at the probe disk is shown as the lower curve without any bias voltage applied to the deflector plates 140, 142. The upper curve with higher ion current is for the respective magnetic field of the deflection coil and with the second inner plate 142 biased 38V with respect to the first plate 140 at the outer radius of the bend. The difference in these two curves illustrates the increase in the ion current collected due to the addition of the first and second electrostatic deflector plates 140, 142.

It should be noted that the bias voltage applied to the electrostatic deflector plates 140, 142 can be modulated or changed in value to effectively paint a region of the substrate 40. Such a modulated painting action can be used to make a more uniform thickness film over a certain region of the substrate or to preferentially pattern the deposit onto the substrate 40. The electrostatic deflector plates 140, 142 have very little capacitance so that the voltage could be modulated at a high rate. In contrast to this the magnetic coils have an appreciable inductance which would limit the rate at which the magnetic field value of the deflection coil could be modulated.

FIG. 6 illustrates a magnetic field pulsed laser deposition system 200 according to a third embodiment of the present invention. The system 200 includes the target 30, the substrate 40 and a deflection magnet 210. The deflection magnet 210 is generally an annular magnetic member and has a first end 212 and an opposing second end 214. The deflection magnet 210 preferably is formed of an electromagnetic core, i.e., metal, with magnet wire, i.e., #18 gauge copper wire, being wound around the core. The deflection magnet 210 has an opening 216 extending therethrough from the first end 212 to the second end 214. In one exemplary embodiment, the diameter of the opening 216 is about 3.5 cm. The deflection magnet 210 is preferably a linear member and in contrast to the deflection magnet 130 of FIG. 2, the deflection magnet 210 does not have any bend incorporated therein. Thus, the generated plume 31 follows a generally linear path through the opening 216 from the target 30 to the substrate 40.

In this embodiment, the deflection magnet 210 has an access port 220 formed therein at a selected location near the first end 212. The target 30 is coupled to a rotatable target holder 29. The dimensions of the target 30 and the target holder 29 are such that each is received within the opening 216. Typically, the target 30 and the target holder 29 are inserted into the opening 216 at the first end 214 so that the target 30 is positioned proximate to the access port 220. The access port 220 permits the laser beam from the external laser 20 to pass through the access port 220 and strike the rotating target 30 disposed within the opening 216 of the deflection magnet 210.

Similar to the other embodiment, the target 30 is ablated by the laser beam to generate the plume 31 and the deflection magnet 210 generates a magnetic field axially along the length of the deflection magnet 210. The magnetic field generates an intense plasma (plume 31) and magnetizes the electrons and causes them to spiral along the longitudinal axis of the deflection magnet 210 resulting from the laser pulse. The magnetic field magnetizes the electrons causes them to spiral along the magnetic field lines with a generally helical radius that is less than the diameter of the opening 216. Because the magnetic field is parallel to the laser plume, the plume 31 travels through the deflection magnet 210 toward the second end 214 where the plume components exit the deflection magnet 210 and are deposited onto the substrate 40.

This embodiment does not include the confinement magnet 110 (FIG. 2) as it is not needed due to the target 30 already being disposed within the deflection magnet 210. In addition, because the deflection magnet 210 does not include a bend, the first and second plates 140, 142 (FIG. 3) are not used in this configuration.

The embodiment shown in FIG. 6 is preferably intended for use in applications where the generation of a high kinetic energy is advantageous and also because of the substantially linear nature of the deflection magnet 210, this embodiment should be used for applications having pure or highly pure targets 30. Because the atomic clusters and any particulates formed during the laser ablation process follow a path along the magnetic field lines within the opening 216, these components are also directed at the substrate 40. The substrate 40 is disposed near the second end 214 and is spaced in an axial relationship with the opening 216 so that the plume 31 is deposited directly onto the substrate 40. In applications where the target is sufficiently pure, i.e. carbon applications, this embodiment may be used as these applications typically do not produce a significant amount of atomic clusters and particulates, both of which are undesirable.

FIG. 7 illustrates a magnetic field pulsed laser deposition system 300 according to a fourth embodiment of the present invention. The system 300 includes the target 30, the substrate 40 and a deflection magnet 310. The deflection magnet 310 has an "S" shaped configuration and includes a first end 312 and an opposing second end 314. The deflection magnet 310 is preferably a substantially annular member and is formed of an electromagnetic core, i.e., metal, with magnet wire, i.e., #18 gauge copper wire, being wound around the core. The deflection magnet 310 has an opening 316 extending therethrough from the first end 312 to the second end 314. In one exemplary embodiment, the diameter of the opening 316 is about 3.5 cm. In this embodiment, the deflection magnet 310 has an access port 320 formed therein at a selected location near the first end 312. The target 30 is coupled to the rotatable target holder 29 and both are inserted into the opening 316 at the first end 314 so that the target 30 is positioned proximate to the access port 320.

According to this embodiment, the deflection magnet 310 has two bends designed into its structure. More specifically, the deflection magnet 310 has a first bend 330 and a second bend 340. The first bend 330 is formed between the first end 312 and the second end 314, while the second bend 340 is formed at the second end 314. Preferably, each of the first and second bends 330, 340 has a 45° angle and therefore in combination, the first and second bends 330, 340 produce an "S" shaped configuration for the deflection magnet 310.

The deflection magnet 310 preferably includes two sets of first and second deflector plates 140, 142 and plates 144, 146 with the first and second plates 140, 142 being associated with the first bend 330 and the first and second plates 144, 146 being associated with the second bend 340. As shown in the cross-sectional view of FIG. 7, there is a section 311 of the deflection magnet 310 which intersects the initial axial direction of travel of the plume 31 and therefore, the plume 31 will strike the section 311 if the plume 31 traveled in a linear direction after it is formed in the opening 316. As with the embodiment of FIG. 2, the plate 140 disposed along the first section 311 is charged negatively so as to repel the negative electrons and cause the electrons to travel around the first bend 330. The first plate 144 is charged negatively with respect to the second plate 146 to assist the electrons in traveling around the second bend 340. In other words, the plates 140, 142 and the plates 144, 146 exert an electrical field that prevents the electrons from moving to the outside bend radius and away from the directed plume 31. The electric field directed across the opening 316 from the second plate 146 to the first plate 144 disposed along the second bend 340 of the deflection magnet 310 helps keep the negative electrons away from the curvature 313 of the second bend 340. The ions are attracted to the electrons and are thus assisted to follow the electrons along the magnetic field direction and the ions successfully navigate the first 45° bend 330 and then the second reverse 45° bend 340.

The substrate 40 is disposed proximate to and in axial relationship with the opening 316 so that the plume 31 is deposited onto the substrate 40 after negotiating the second bend 340. Because the first bend 330 preferably is a 45° bend and the second bend 340 is a 45° bend, the plume 31 exits parallel to the initial plume direction after it has been formed and travels within the opening 316 before encountering the first bend 330. As with the embodiment of FIG. 2, the incorporation of the first and second bends 330, 340 is designed to filter the undesired material from the plume 31 because the uncharged matter is not influenced by the magnetic field and travels in a linear-direction from its formation. In other words, the atomic clusters and the large particulates do not effectively navigate the first and second bends 330, 340.

This embodiment has several advantages. First, the basic geometry of a deposition chamber can be retained with a lateral displacement of the target holder 29 being the principle geometry change required. Second, better particulate filtering is achieved due to the additional bending introduced by the second bend 340. Third, the ions that tend to drift to the outside of the first bend 330 are then on the inside of the bend for the second bend 340.

FIG. 8 illustrates a magnetic field pulsed laser deposition system 400 according to a fourth embodiment of the present invention. The system 400 includes the target 30, the substrate 40, the confinement magnet 110 and the deflection magnet 210. The fourth embodiment is similar to the second embodiment in that the plume 31 is passed through the confinement magnet 110 before it enters the deflection magnet 210. One of the main differences between the second and fourth embodiments is that the access port 220 is eliminated in the fourth embodiment. Instead, the target 30 and the target holder 31 are positioned outside of the deflection magnet 210 as in the second embodiment. By eliminating the need for the laser access port 220, stronger magnetic fields can be generated without excessive heating considerations as arise when a resistive coil is used. By eliminating the access port 220, additional current may be driven through the deflection magnet 210.

As in the second embodiment, the plume 31 is focused by the magnetic field of the confinement magnet 110 before it is directed into the deflection magnet 210 which is a linear member. The parallel magnetic field generated by the deflection magnet 210 causes the electrons to spiral along the magnetic field lines with a generally helical radius and the ions are "dragged" by the electrons to the substrate. By using the confinement magnet 110 to focus the plume 31, the magnetic field of the deflection magnet 210 does not have to be as strong in order to start directing the electrons through the deflection magnet 210.

As previously-mentioned in the discussion of the second embodiment, this arrangement is more suited for applications where the target 30 is pure or has a high level of purity since the linear nature of the deflection magnet 210 causes all of the components of the plume 31 to be directed at the substrate 40.

FIG. 9 illustrates a magnetic field pulsed laser deposition system 500 according to a fifth embodiment of the present invention. The system 500 is similar to the system 300 of the third embodiment with the exception being that the target 30 and target holder 31 are disposed outside of the deflection magnet 310. Instead, the confinement magnet 110 is used to focus and converge the plume 31 after it is formed by directing the laser beam onto the target 30. The plume 31 then passes into the opening 316 of the deflection magnet 310 where it is influenced by the magnetic field as previously discussed with reference to FIG. 7. Because of the "S" shaped configuration of the deflection magnet 310, the plume 31 is effectively filtered so that only the desired components, i.e., the atomic species atoms and ions, are directed onto the substrate 40 to form the thin film. This permits any number of target materials to be used without substantial concern as to the purity of the target.

Each of the systems of the various embodiments of the present invention are preferably performed in a vacuum environment, such as a vacuum chamber. In addition, the substrate 40 is often cleaned prior to being used in the system. Conventional substrate cleaning techniques may be used, including using several ultrasonications in heptane, followed by a drying in a stream of dry nitrogen gas. Prior to loading the substrate 40 into the vacuum chamber, any organic residue or other contamination on the substrate surface is preferably removed using laser ablation using the same excimer laser which is used to produce the thin film. The substrate 40 may be maintained at room temperature and can be heated, if necessary, to improve film adhesion and/or crystallinity. The substrate 40 may also be biased, floated, or held at ground potential.

Figure 10:
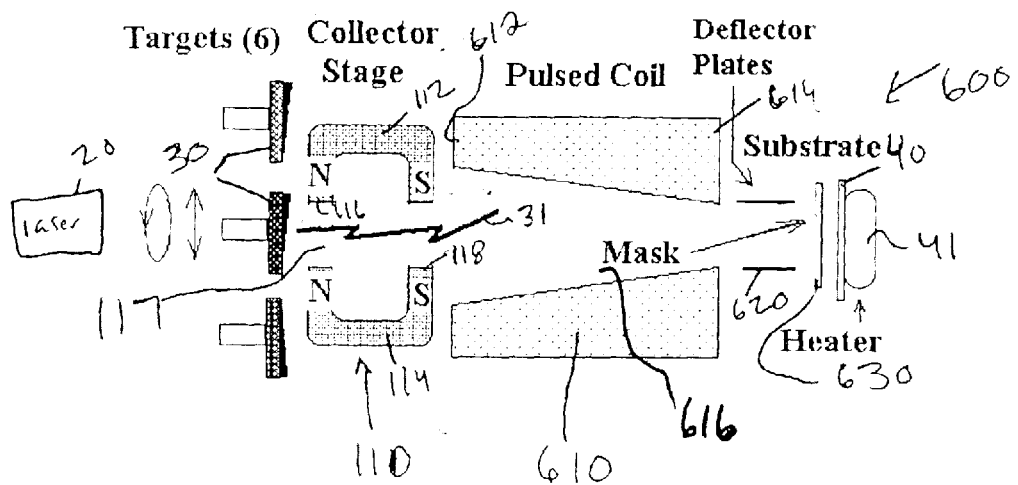
FIG. 10 is a cross-sectional view of an ion assisted pulsed laser deposition system according to a seventh embodiment.

Now referring to FIG. 10 in which another exemplary embodiment is shown in the form of an ion assisted pulsed laser deposition system 600. The system 600 has some similar components as the other previously described systems and therefore, for sake of brevity, similar or alike components will be not described in great detail. The system 600 includes excimer laser 20 and in one embodiment, the laser light preferably has an ultraviolet wavelength of about 248 nm and operates at approximately 1–1.3 J per pulse. As with the other systems, the system 600 and a method of operation thereof produce thin particulate free diamond like carbon films that can be made with good adhesion onto even room temperature substrates. The present method, as described below, employs a filtered ionized carbon beam created by the vacuum impact of the laser 20 onto the target 30. The resultant deposition beam can be steered and deflected by magnetic and electric fields to paint a specific surface of substrate 40. It is also within the scope of the present system 600 that the substrate 40 can be heated by heater 41 to and elevated temperature.

One advantage of this deposition method is that the resultant films are particulate free and formed only as the result of atomic species impact. The carbon films exhibit the high hardness characteristic of diamond like carbon (DLC) films. It should be noted that particulate free films can be deposited by this method that are either metallic, semiconducting, or insulating.

The system 600 also includes the confinement magnet 110 formed of the pair of permanent magnets 112, 114 which are used to produce a magnetic field parallel to the plume ejection direction in front of the laser target 30. Each of the magnets 112, 114 has a north (N) pole 116 and a south (S) pole 118. Magnets 112, 114 are arranged so that the N pole 116 of the magnet 112 opposes the N pole 116 of the magnet 114 and the S pole 118 of the magnet 112 opposes the S pole 118 of the magnet 114. The like magnetic poles 116, 118 oppose each other so that the magnetic field from each of the magnets 112, 114 loops from the N magnetic pole 116 to the S magnetic pole 118 of each of magnets 112, 114 creating a magnetic field that is substantially parallel to the plume direction. This parallel magnetic field prevents the plume 31 from further converging and actually causes the plume 31 to become refocused into a narrow plume 31 as it travels through the confinement magnet 110.

In one embodiment, the confinement magnet 110 generates a relatively strong magnetic field that can be created without introducing a joule heating that would accompany a magnetic field generated by introducing a current in a resistive solenoid. In one embodiment, the target 30 is actually in the form of a plurality of computer selectable targets 30 arranged in a predetermined pattern. For example and according to one exemplary embodiment, there are six targets 30 that are arranged about 60 degrees from each other about a ring holder. Each target 30 is rotated about an axis perpendicular to the ring and the ring position is oscillated during deposition so that the laser beam impacts over most of the approximately 2.5 cm diameter of the selected target. The surface of each target holder 30 is preferably beveled at about 15 degrees away from the ring plane so that the laser beam which is usually directed at 45 degrees to the plane of the ring, impacts the target surface at varying angles from approximately 30 degrees to 60 degrees as the target 30 rotates. The beveled nature of the target 30 is indicated by reference number 31 and this beveled target surface thus prevents the laser beam from forming a constant angle etch pit pattern into the target surface that normally slows the laser ablation process once this constant angle etch pit pattern becomes established. Since the impact plume is nominally directed normal to target surface, the beveled target surface 31 also causes the plume direction to sweep over an arc and more fully randomize the ion spatial distribution that enters the collector magnet stage (the confinement magnet 110) and the parts downstream therefrom. A more even film coating thus also results over the substrate surface. The target erosion continues over a long period of time since the target surface does not develop a constant angle etch pit pattern that generally slows the deposition process.

As can be seen from FIG. 10, the gap 117 is formed between the magnets 112, 114 and the laser 20 may be positioned so that the laser beam is directed through this gap 117 onto the target 30. One of the targets 30 is disposed a predetermined distance from one end 115 of the magnets 112, 114. The distance the selected target 30 should be placed from the magnets 112, 114 depends upon several factors, including but not limited to the type of material forming the target 30. In any event, the target 30 and the magnets 112, 114 should be placed at a distance where substantially all of the plume 31 will be directed into the gap 117. As best show in FIG. 10, the central region of the selected target 30 at which the laser beam is directed should be axially aligned with the gap 117 so that the plume 31 travels into the gap 117.

The system 600 also includes a pulsed coil 610 that is disposed proximate one end of the magnets 112, 114. In the exemplary embodiment that is illustrated, the coil 610 is a tapered throat high field pulsed coil that collects the ion beam over a relatively wide solid angle and concentrates the beam toward the substrate 40. The pulsed coil 610 has a first end 612 that is proximate one end of the magnets 112, 114 where the ion beam exits and an opposing second end 614 that faces the substrate 40. The pulsed coil 610 includes a through bore 616 which is axially aligned with the gap 117 so that the ion beam (plume 31) can exit the confinement magnet 110 (collector stage) and be directed into the through bore 616 at the first end 612. The pulsed coil 610 is constructed so that the through bore 616 is of a tapered construction in that the bore 616 has a greater diameter at the first end 612 and a less diameter at the second end 616. In other words, the through bore 616 tapers inwardly toward the second end 614.

The laser 20 is triggered only when the current in the pulsed coil 610 reached a predetermined threshold value, e.g., about 200 A. The current in the pulsed coil 610 has a rise time of 1–2 ms to 200–240 A after which the laser 20 is triggered by a comparator circuit. The laser in use can be triggered at a repetition rate up to 50 Hz. One element that is not illustrated but is preferably included in the system 600 is a window protector circuit that prevents atoms from the laser plume 31 from coating the inside of the laser entry window. This allows long term depositions to be done under vacuum conditions so that long mean free paths are realized for the ion beam.

The system 600 further includes deflector plates 620 that can be used to sweep the ion beam across the substrate 40. In the illustrated embodiment, the deflector plates 620 each includes a planar surface (e.g., they are elongated, planar plates) and they are disposed proximate the second end 614 of the pulsed coil 610. The deflector plates 620 are orientated and spaced apart from one another such that the distance between the plates 620 is about equal to or greater than the diameter of the through bore 616 at the second end 614. This permits the ion beam that exits the second end 614 of the pulsed coil 610 to enter the space between the deflector plates 620.

Further, a movable mask 630 can optionally be used to pattern the deposition. The mask 630 has a predetermined pattern formed therein and is disposed between the deflector plates 620 and the substrate 40.

The present deposition system 600 has similarities and differences from other previous ion deflector systems. One is that for metal elemental or alloy targets, such as Co and Py, a straight through coil can be used since particulates are much less of a problem in that case. The action then is to produce an ion pulsed modified deposition that allows high film adhesion to be obtained onto even room temperature substrates 40. If desired, the pulsed coil 610 can be of the type that includes a 45 degree bend which can be substituted to avoid any direct line of sight between the target 30 and the substrate 40. Other principle differences includes the use of a high field permanent magnet collector stage 110 that provides easy access for the laser beam 20 to the six computer selectable targets 30.

There are a number of advantages that are achieved with the present system 600 as compared to conventional sputtering systems including but not limited to the following. First, the high pulsed ion energy allows films with good adhesion to be deposited onto even room temperature substrates 40. For example, Co films deposited onto room temperature glass substrates 40 can be forcefully rubbed with a pencil eraser without signs of any film degradation.

Conventional sputtered films generally have poor substrate adhesion unless substrate heating is added. If desired, the substrates in this ion beam assisted system 600 can be heated during deposition to obtain directly deposited crystalline films. The second, is the diamond like carbon (DLC) type films can be made that are not produced by a conventional sputtering system. The third is the ease with which layered structures employing DLC films in conjunction with other magnetic and nonmagnetic layers can be made as the device structures in the same system. In one embodiment, a 4.5 cm diameter region is relatively uniformly coated at a distance of 3 cm beyond the pulsed coil 610. An AC voltage is applied to the deflector plates 620 of FIG. 10 can be used to obtain greater film thickness uniformity over such a region. A larger system or substrate motion can be employed to coat larger area wafers.

In one exemplary embodiment, the system 600 with the tapered pulsed coil 610 design and utilizing a straight coil, the deposition enhancement factor has been measured by comparing the optical transmission of films deposited with the permanent magnet section 110 and the pulsed coil current to films deposited in the same geometry without the permanent magnet section 110 and without coil current pulsing. Cobalt films deposited for the same number of laser pulses with the permanent magnet section 110 and coil pulsing measured an optical density of 3.0. When cobalt films were deposited without the permanent magnet section 110 and without coil current, an optical density for the films of 0.20 was obtained. (Optical density is defined as $\log_{10}(I_0/I_t)$. An optical density of 3 means that only 1 part in 1000 or 0.1% of the incident light is transmitted. An optical density of 0.20 means that 63% of the incident light is transmitted.

Figure 11:
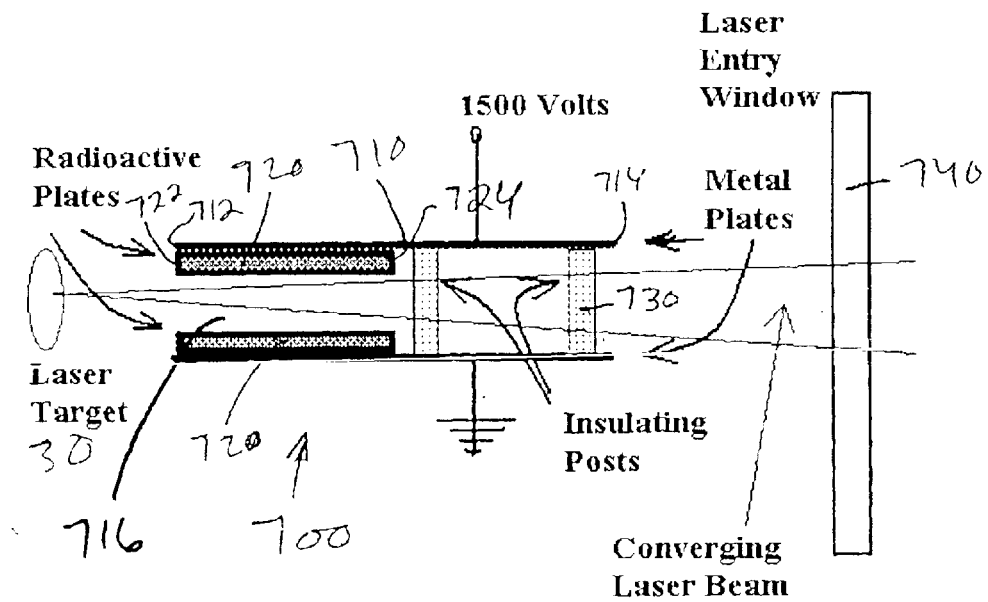
FIG. 11 is a cross-sectional view of a device for keeping clean the inside of a deposition chamber laser entry window.

In another aspect of the present invention and as illustrated in FIG. 11, a device 700 is provided to overcome the following problem. In a pulsed laser deposition system, a high energy defocused laser beam enters a deposition system through a window to ablate material from a laser target 30. Part of the generated plume of material 31 is then collected onto a substrate to form a film but a part of the plume 31 can travel back along the line of sight of the laser beam to coat the inside of the laser entry window and then impede further entry of the laser beam into the system. Normally, a low pressure inert gas, such as argon, is used inside the chamber to slow the coating of the inside of the laser entry window. But when depositions requiring a relatively long means free path for the plume 31 is required, as in any system requiring ion collection and deflection, the gas protecting the window also impedes the ion beam. The device 700 addresses this problem and allows long term depositions under vacuum conditions to become possible.

The device 700 acts to keep the inside of the deposition chamber entry window from being coated by the laser pulse generated plume 31 of atoms, ions, and particles released from the laser target 30. The device 700 includes a pair of metal plates 710 and a pair of radioactive plates 720 that are arranged relative thereto with both being proximate the laser target 30. Each plate 710 has a first end 712 and a second end 714 and the radioactive plate 720 has a first end 722 and a second end 724 with the first ends 712, 724 being preferably aligned with one another. The metal plates 710 are spaced apart from one another so that a space 716 is formed therebetween which can accommodate the radioactive plates 720 and still leave a space between the radioactive plates 720 to permit the laser beam to travel from one end 714 of the plates 710 to the other end 712 of the plates 710. In one exemplary embodiment, each metal plate 710 measures approximately 16 cm long by 6 cm depth into the plane as shown in FIG. 11. The radioactive coated plates 720 measure 8 cm in length by 6 cm depth into the plane of the FIG. 11. In this embodiment, the radioactive plates 720 are attached to the back section of the metal plates 710. Thus, the length of the radioactive coated plate 720 is equal to or approximately ½ the length of the metal plates 710.

As illustrated, a plurality of posts 730 (e.g., ceramic posts) are disposed between the metal plates 710 in the area from the ends 724 of the radioactive plates 720 to the ends 714 of the metal plates 710. In one embodiment, the posts 730 separate the metal plates 710 by about 3 cm. The posts 730 provide structural support to the components as well as spacing the plates 710 apart. A potential difference (e.g., a 1500 volt potential difference) is applied between the metal plates 710. As illustrated in FIG. 11, one of the metal plates 710 can be at ground potential for ease in attaching the structure near the vacuum side of a laser entry window, generally indicated at 740.

The device 700 acts to keep the inside of the deposition chamber laser entry window 740 from being coated by the laser pulse generated plume of atoms, ions and particles released from the laser target 30. The in general converging pulsed laser beam enters the deposition through the laser entry window 740 while being focused to impinge upon the laser target 30. In general, the laser beam must still be defocused while entering the chamber to avoid damaging the laser entry window 740. The spacing between the metal plates 710, radioactive plates 720, and insulating posts 730 is made large enough so as not to interfere with the converging laser from reaching the target 30. After the focused laser beam impacts the laser target 30, a plume 31 of atoms, ions and particulates is generated. Part of this generated plume of ions is then captured and focused by the magnet 110 and deflector coils to coat the substrates 40 with the desired materials. But part of the plume of material is also emitted in a direction back along the site of the laser beam which would soon coat the inside of the laser window 740 with a coating of material that then interferes with the subsequent entry of the laser pulses into the chamber.

In a conventional pulse laser deposition system, a low pressure of gas, such as argon, is maintained inside the deposition system so that the plume 31 is directed back toward the laser entry window 740 and is scattered by gas atom collisions to help keep the inside of the laser entry window 740 clean. The laser entry window 740 must usually be cleaned frequently often after only one or two deposition runs. In most practical PLD systems, the distance from the inside of the laser entry window 740 to the laser target 30 is made greater than the distance from the laser target 30 to the substrate 40 on to which the deposition is collected. But this gas used to help keep the inside of the laser entry window 740 clean also acts to scatter the plume of ions and any ions subsequently deflected and used to facilitate a film deposition. If attempts to operate the pulsed laser deposition system under vacuum conditions to facilitate a long mean free path for ion deposition plume then the inside of the laser entry window 740 may become sufficiently coated so as to restrict subsequent laser pulse entry into the system after only a few minutes of operation. Further deposition could then only be possible after stopping to clean the inside of the laser entry window 740.

The system 700 solves this problem by allowing continued long term deposition under vacuum conditions without the inside of the laser entry window 740 becoming coated. The action is such that the plume of atoms, ions and particulates, heading back toward the entry window 740, is ionized by the stream of radioactive alpha particles, beta particles, and gamma rays released from the radioactive plates 720. The ionized plume material is then deflected toward one of the metal plates 710 and thus no longer coats the inside of the laser entry window 740. In operation, the pulsed laser deposition system 700 may then be operated under vacuum conditions for weeks at a time before it then becomes necessary to clean the inside of the laser entry window 740.

The radioactive plates 720 can come from any number of different sources. For example, the radioactive plates 720 can be coated with a glaze of made from uranium salt trailings. Any other radioactive source of the proper activity can be used. Only microcuries or less of activity, which is below licensing requirements, is required.

Using the PLD method of the present invention, extremely clean and uniform coatings formed from a number of single element targets as well as multi-element targets may be produced. For example, cobalt, permalloy (Ni, Fe based alloys), samarium cobalt, titanium carbide and nitride and carbon and diamond-like carbon films, to name a few, may be formed using the PLD method of the present invention. The present method allows films to be deposited onto bare substrates as well as onto previously made film layers including metallic, glassy or amorphous materials, insulating and semiconductor materials.

Further, using the present PLD method, diamond-like carbon films have been deposited onto glass and other types of substrates, such as an Si substrate. The present films can be deposited onto metallic, glass, insulating and semiconductor substrates. A particularly useful potential application involves the deposition of diamond-like carbon films as a part of semiconductor magnetic tunnel junctions. The magnetic field PLD systems of the present invention demonstrate particulate reduction without sacrificing film growth rates. Furthermore, the present invention also offers additional advantages relative to other conventional systems. For example, the PLD method of the present invention permits the removal of the atomic clusters and particulates from the atomic species contained in the plume without the introduction of physical shadowing that requires the introduction of sufficient gas pressure to physically scatter the atomic species behind the shadow. The relative surface mobility of the directed plume atoms arriving at the substrate 40 can be controlled by controlling the pulse repetition rate. Also, since the transit time to the substrate 40 can be short compared to the time between pulses, the deflection and confinement magnets can be operated in a pulsed mode also to minimize the total power dissipated by these electromagnets.

Accordingly, the present invention, provides a simple, relatively inexpensive, yet effective PLD method of forming extremely clean films with reduced particulate densities and size. This method favors useful film properties, such as crystallinity and good adhesion, event at room temperature, because it relies upon using high energy ions for the deposition. The method therefore has tremendous potential for applications where the substrate is thermally sensitive. The present method may be applied to the production of a film from a great number of materials.

Several attributes of the present invention, such as the incorporation of a laser entry window stay clean circuit, and the use of beveled faced rotating targets, allow repeated long term depositions to be made in rapid succession.

While the invention has been particularly shown and described with reference to preferred embodiments thereof, it will be understood by those skilled in the art that various changes in form and details may be made therein without departing from the spirit and scope of the invention.

What is claimed is:

1. A device for maintaining cleanliness of an interior of a deposition chamber laser entry window through which a laser beam enters and converges to a target, the device comprising: a laser entry window; a laser ablation target that is positioned relative to said laser entry window such that the target can be ablated by a laser beam entering the deposition chamber through said laser entry window;

a pair of first members disposed between the laser entry window and the target, the first members being spaced a distance apart from one another;

a pair of radioactive members disposed in the space between the pair of first members; and wherein the first members are operatively connected to a voltage source and ground so that a voltage potential difference is created therebetween, the converging laser beam entering the space between the first members at one end thereof and traveling therebetween in a converging manner toward the target and wherein a plume that is generated when the laser beam ablates the target is ionized by the radioactivity of the radioactive members such that the ionized plume is deflected toward one of the first members as opposed to coating the interior of the laser entry window.

2. The device of claim 1, wherein each of the first members comprises a conductive plate, one of the conductive plates being connected to the voltage source, the other being connected to ground.

3. The device of claim 1, wherein each of the radioactive members comprises a radioactive plate.

4. The device of claim 3, wherein the radioactive plates are attached to backsides of the first members which are in the form of metal plates.

5. The device of claim 4, wherein first ends of the radioactive plates align with first ends of the metal plates and each radioactive plate has a length less than a length of the metal plate.

6. The device of claim 5, wherein the length of each radioactive plate is about ½ the length of the metal plate.

7. The device of claim 1, further including a plurality of insulating posts disposed between the first members at locations which are free of the radioactive members.

8. The device of claim 7, wherein the insulating posts space the metal plates apart by about 3 cm.

9. A method for maintaining cleanliness of an interior of a deposition chamber laser entry window through which a laser beam enters and converges to a target, the method including the steps of:

disposing a pair of first members between the laser entry window and the target, the first members being spaced a distance apart from one another;

disposing a pair of radioactive members in a space between the pair of first members;

operatively connecting the first members to a voltage source and ground, respectively, so that a voltage potential difference is created therebetween;

ablating the target with a laser beam creating a plume; and ionizing components of the plume by the radioactivity of the radioactive members thereon such that the ionized plume is deflected toward one of the first members as opposed to coating the interior of the laser entry window.

10. The method of claim 9, wherein the voltage potential difference is about 1500 V.

11. The method of claim 9, wherein each of the first members comprises a conductive plate, one of the conductive plates being connected to the voltage source, the other being connected to ground, each of the radioactive members comprising a radioactive plate that is attached to one backside of one first member.

12. The method of claim 11, further including the step of:

aligning first ends of the radioactive plates with first ends of the metal plates, wherein each radioactive plate has a length less than a length of the metal plate.

13. The method of claim 9, further including the step of:

disposing a plurality of insulating posts between the first members at locations which are free of the radioactive members.

* * * * *